US010330706B2

(12) United States Patent
Sander et al.

(10) Patent No.: US 10,330,706 B2
(45) Date of Patent: Jun. 25, 2019

(54) OPTICAL ELECTRICAL MEASUREMENT SYSTEM, A MEASUREMENT PROBE AND A METHOD THEREFOR (71) Applicant: TELEFONAKTIEBOLAGET LM ERICSSON (PUBL), Stockholm (SE)

(72) Inventors: Sverker Sander, Billdal (SE); Björn Olsson, Göteborg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 221 days.

(21) Appl. No.: 15/314,702

(22) PCT Filed: Jun. 4, 2014

(86) PCT No.: PCT/EP2014/061622
§ 371 (c)(1),
(2) Date: Nov. 29, 2016

(87) PCT Pub. No.: WO2015/185133
PCT Pub. Date: Dec. 10, 2015

(65) Prior Publication Data
US 2017/0102412 A1 Apr. 13, 2017

(51) Int. Cl.
G01R 13/04 (2006.01)
G08C 19/36 (2006.01)
G08C 23/04 (2006.01)
H04Q 9/00 (2006.01)
(Continued)

(52) U.S. Cl.
CPC ......... *G01R 13/04* (2013.01); *G01R 31/2818* (2013.01); *G01R 31/3025* (2013.01);
(Continued)

(58) Field of Classification Search
CPC . G01R 31/3025; G01R 31/30; G01R 31/1828
See application file for complete search history.

(56) References Cited

U.S. PATENT DOCUMENTS 5,408,189 A 4/1995 Swart et al.
2007/0019207 A1* 1/2007 Kuhn ............... G01B 11/06
356/511
(Continued)

FOREIGN PATENT DOCUMENTS

CN 1982857 A 6/2007
CN 203574655 U 4/2014
(Continued)

OTHER PUBLICATIONS

European Office Action issued in Application No. 14728928.4 dated Nov. 5, 2018, 6 pages.
(Continued)

*Primary Examiner* — Giovanni Astacio-Oquendo
*Assistant Examiner* — Alvaro E Fortich
(74) *Attorney, Agent, or Firm* — Rothwell, Figg, Ernst & Manbeck, p.c.

(57) ABSTRACT

The present invention relates to a system, a measurement probe and a method for measuring an electrical property of an electrical circuit, comprising measuring the electrical property by means of a measurement probe connected to the electrical circuit, converting the measured electrical property of the electrical circuit to an optical signal. The method further comprises sending the optical signal, and receiving the optical signal by means of an image sensor configured to record images comprising the measurement probe that transmits the optical signal. The method further comprises processing the recorded images in order to decode the measurement data from the received optical signal.

20 Claims, 6 Drawing Sheets (51) Int. Cl.
    *G01R 31/28*     (2006.01)
    *G01R 31/302*     (2006.01)
    *G01R 31/309*     (2006.01)

(52) U.S. Cl.
    CPC ............ *G08C 19/36* (2013.01); *G08C 23/04* (2013.01); *H04Q 9/00* (2013.01); *G01R 31/309* (2013.01)

(56) References Cited

U.S. PATENT DOCUMENTS

| 2007/0275588 | A1 | 11/2007 | Bodette et al. |
| 2008/0272793 | A1* | 11/2008 | Romanov .......... G01R 1/06794 324/755.01 |
| 2013/0278982 | A1* | 10/2013 | Huys ........................ G03H 1/26 359/22 |

FOREIGN PATENT DOCUMENTS

| CN | 103812558 | A | 5/2014 |
| GB | 2274211 | A | 7/1994 |
| GB | 2340233 | A | 2/2000 |
| JP | H08160080 | A | 6/1996 |
| WO | 9930172 | A2 | 6/1999 |
| WO | 2008056874 | A1 | 5/2008 |

OTHER PUBLICATIONS

"Ultrabright 0402 ChipLED", Vishay, Vishay Semiconductors, Rev. 1.4, Document No. 82522, Jul. 10, 2014, 8 pages.

International Search Report dated Feb. 4, 2015 in International application No. PCT/EP2014/061622, 4 pages.

International Preliminary Report on Patentability (dated Sep. 7, 2016) issued in International application No. PCT/EP2014/061622, 6 pages.

Chinese Search Report with English Translation, issued in corresponding Chinese Application No. 201480078884.0, dated Feb. 21, 2019, 5 pages.

First Chinese Office Action with English Notification and Summary, issued in corresponding Chinese Application No. 201480078884.0, dated Mar. 1, 2019, 10 pages.

* cited by examiner

OPTICAL ELECTRICAL MEASUREMENT SYSTEM, A MEASUREMENT PROBE AND A METHOD THEREFOR

CROSS REFERENCE TO RELATED APPLICATION(S)

This application is a 35 U.S.C. § 371 National Stage of International Patent Application No. PCT/EP2014/061622, filed Jun. 4, 2014, designating the United States, the disclosure of which is incorporated by reference.

TECHNICAL FIELD

The present invention relates to an electrical measurement system with a measurement probe as well as a method therefore. In particular the present invention relates to an electrical measurement system and a measurement probe that communicates the measurement data using optical signals.

BACKGROUND

A recurring problem during testing of electrical circuits is that the number of signals that are of interest is larger than the number of available measurement channels of the measurement system. All signals are therefore not recorded simultaneously but rather merged in a fictive montage after completion of the measurement. Another problem frequently encountered is that the circuit is so dense populated with components that it is nearly impossible to reliable probe signals provided physical close to each other.

A common solution to this problem is to utilize a dedicated probe card with connection pins arranged in a geometric configuration suitable for the DUT (device under test). However, such a probe card may be very expensive and hard to probe in a reliable manner. It is very easy to obtain a bad connection from the DUT to the connection pins of the probe card. In order to achieve a good measurement a dedicated probe station may be used. The dedicated probe station offers rigid mechanics for holding the probe card and the DUT and precise actuators for controlling the probe card and to bring the connection pins in contact with the DUT. The probe station may in some configurations be very expensive.

Another solution to this measurement problem is to utilize a dedicated measurement robot that is configured to move a measurement probe to different positions on the DUT. Due to the decreasing dimensions of the circuits the measurement robot needs to be very precise and a precision of +/−50 micrometer is often necessary. This solution is limited by several factors such as for example the number of arms of the robot, another problem is the cost associated with such a dedicated measurement robot.

Another problem with known measurement systems is that the cost of the measurement system is directly proportional to the number of measured signals and the density of the circuit. Hence, in order to monitor a modern circuit such as a DC/DC converter system, or a field programmable gate array, a vast number of measurement channels are needed and the measurement system becomes very expensive.

Therefore, a need for an improved electrical measurement system and method exists.

SUMMARY

It is an object of exemplary embodiments of the invention to address at least some of the issues outlined above. This object and others are achieved by the system, the measurement probe, and the method according to the appended independent claims, and by the embodiments according to the dependent claims.

The present invention provides a method for measuring an electrical property of an electrical circuit. The method comprises measuring the electrical property by means of a measurement probe connected to the electrical circuit, and converting the measured electrical property of the electrical circuit to an optical signal. The method further comprises sending the optical signal, and receiving the optical signal by means of an image sensor configured to record images comprising the measurement probe that transmits the optical signal. The method further comprises processing the recorded images in order to decode the measurement data from the received optical signal.

The present invention provides a measurement system for measuring an electrical property of a connectable electrical circuit. The system comprises a measurement probe configured to be connected to the connectable electrical circuit. The measurement probe is configured to measure the electrical property of the electrical circuit and to send information about the electrical property as an optical signal. The system further comprises an image sensor configured to record images of the optical signal transmitted from the measurement probe. The system further comprises a processing circuitry configured to receive the recorded images from the image sensor and to control the image sensor. The processing circuitry comprises means for controlling the image sensor to record images such that the optical information from the measurement probe is captured on the images. The processing circuitry further comprises means for processing the recorded images in order to decode the measurement data from the received optical signal.

The present invention provides a measurement probe, comprising a first terminal and a second terminal. The measurement probe further comprises a measurement circuit connected to the first terminal and to the second terminal. The measurement circuit is configured to measure an electrical property of the electrical circuit, and to convert the measured electrical property to an optical signal. The measurement circuit further comprises means for sending the optical signal.

An advantage of exemplary embodiments is that an improved measurement method and system are provided.

An advantage of certain embodiments is that signals provided physical close to each other may be measured.

An advantage of certain embodiments is that board alignment may not be necessary.

An advantage of certain embodiments is that expensive dedicated probe stations for specific board layouts may no longer be needed.

An advantage of certain embodiments is that a simultaneous real time measurement of a large number of signals is possible.

BRIEF DESCRIPTION OF THE DRAWINGS

In the following description of embodiments of the invention, reference will be made to the accompanying drawings of which.

DETAILED DESCRIPTION

The present invention will now be described more fully hereinafter with reference made to the accompanying drawings, in which preferred embodiments of the invention are shown. This invention may, however be embodied in many different forms and should not be construed as limited to the embodiments set forth herein; rather, these embodiments are provided so that this disclosure will be thorough and complete, and fully convey the scope of the invention to those skilled in the art. In the drawings, like reference signs refer to like elements.

As will be explained in detail below, the present inventors have devised a way to measure electrical signals on a printed board assembly (PBA) by means of measurement probes that send the measurements using optical signals.

First Embodiment

Figure 1:
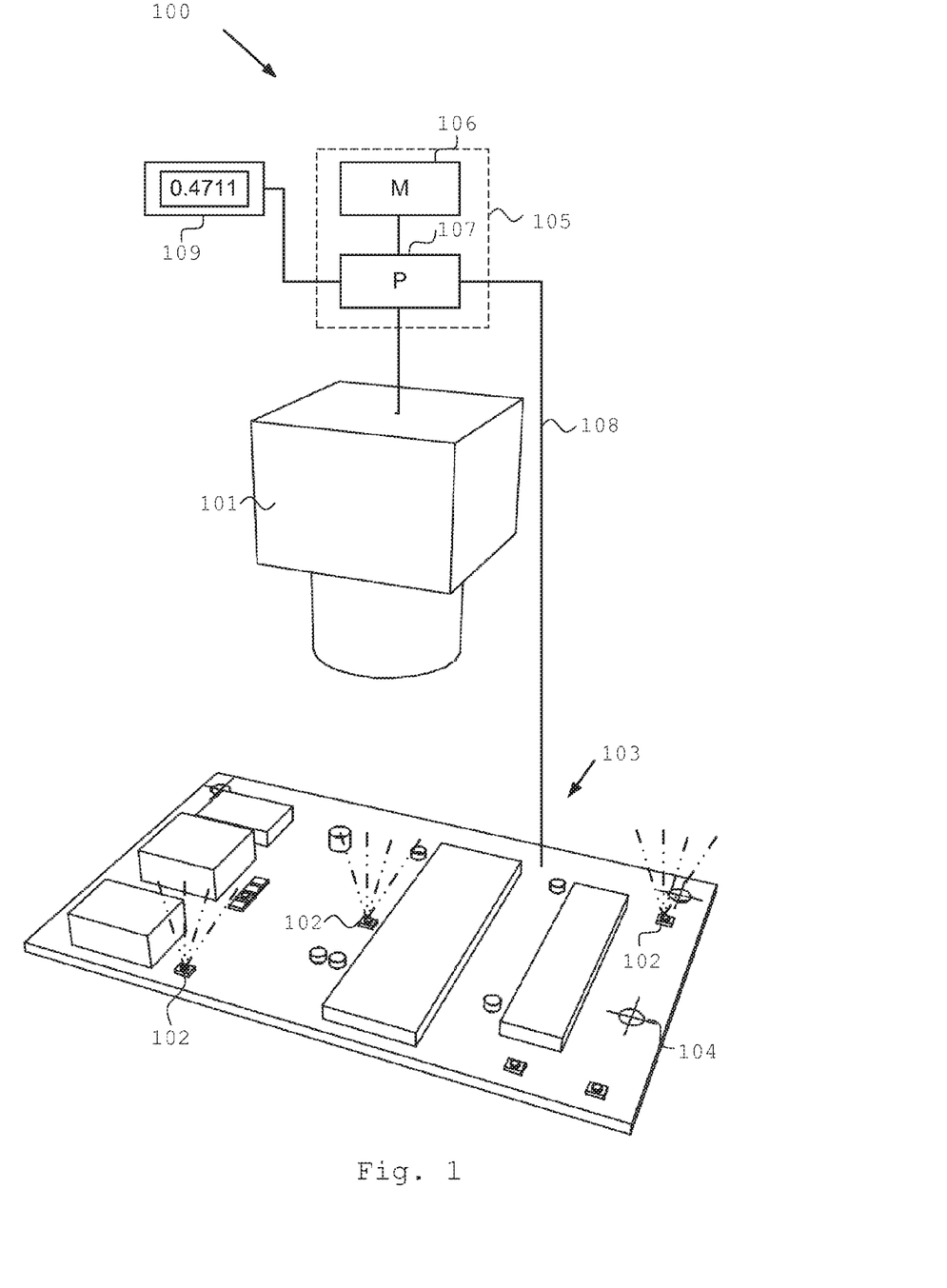
FIG. 1 is a schematic perspective view of a measurement system according to a first embodiment.

FIG. 1 is a perspective view of a measurement system, generally designated 100, according to a first embodiment of the invention.

In FIG. 1 the measurement system 100 comprises measurement probes 102 configured to be connected to an electrical circuit on a printed board assembly (PBA) 103. The PBA may for example comprise electrical circuits such as DC/DC converters, digital signal processing circuits (DSP), microprocessors (uP) and radio frequency power amplifiers (RFPA). The measurement probes 102 are configured to measure electrical properties of the electrical circuit and to send information about the measured electrical properties as optical signals.

The measurement system further comprises an image sensor 101 arranged at a position such that all measurement probes 102 of interest are within the field of view of the image sensor 101. The image sensor 101 is connected to a processing circuitry 105, which may comprise a processor 107 and a memory 106. The processing circuitry 105 may in one embodiment be connected to the electrical circuitry on the PBA 103 for receiving a trigger signal, illustrated in FIG. 1 as a wire 108. The measurement system 100 may further comprise a display unit 109 provided to display the measured electrical properties. The processing circuitry may also comprise a communication circuitry that allows the processing circuitry to send measurements and receive instructions from external equipment such as computers and other measurement equipment.

The measurement probe 102 converts the measured electrical signal to a corresponding optical signal that is sent from the measurement probe 102.

The optical signal is detected by the image sensor 101 and relayed to the processing circuitry. The processing circuitry is operable to record images of the measurement probe 102 and the optical signal transmitted therefrom. The processing circuitry 105 converts the recorded images to measurement data that may be presented on the display unit 109.

In order to determine which measurement probe 102 that sends optical signals, the PBA 103 may be provided with fiducial markers such as cross-hairs 104. Other features of the PBA 103 may be utilized as fiducial markers such as PBA edges, components etc. The processing circuit 105 is configured to use these fiducial markers as orientation help in order to determine the position of the measurement probes 102. Thus, in the present application, the fiducial markers may be features of the PBA that may be used for orientation purposes.

The image sensor 101 may in one embodiment be a high speed camera configured to obtain images in the range of 1 frame per second (fps) up to 1000000 fps. This range allows measurements with a suitable precision. By using a high speed camera a real time monitoring of the measured electrical property might be achieved.

The processing circuit 105 may upon receiving the trigger signal from the PBA 103, by means of for example the wire 108, initiate the conversion from optical signals to measurements. Other trigger signals might be used to start the measurement. Another viable solution is to utilize the optical signal from the measurement probe 102 as a trigger signal.

In one embodiment the measurement system is configured to use combinations of digital optical signals and analogue optical signals. This might be particularly useful if status signals are monitored together with measurements of for example voltages and currents.

One beneficial feature of some embodiments is that a large number of measurement probes can send information simultaneously which gives real time measurement data from the electrical circuit.

Another advantage of this measurement system 100 is that the measurement probe 102 may not interfere with the electrical circuit, due to ground loops and noise injected from the measurement equipment.

Figure 2:
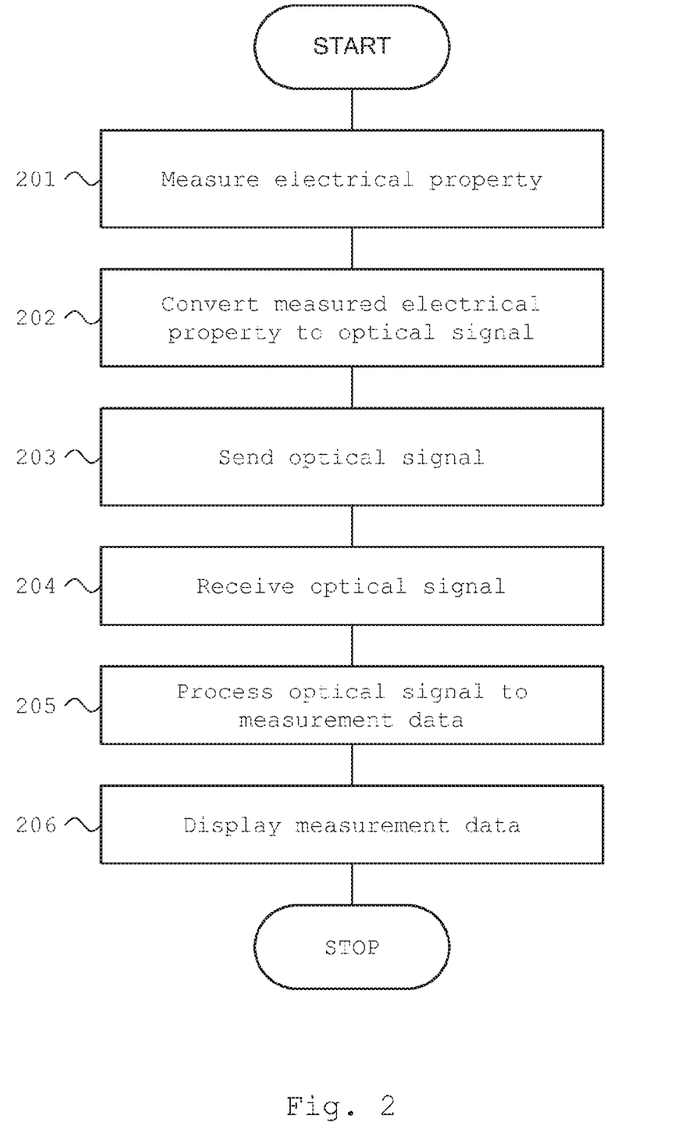
FIG. 2 is a flow chart showing the processes performed by the first embodiment.

FIG. 2 shows a flowchart of the process operations performed by the measurement system 100 for measuring electrical properties of the connected electrical circuit. The measurement method for measuring an electrical property of a connectable electrical circuit comprises:

201: Measure the electrical property with the measurement probe 102 connected to the electrical circuit.

202: Convert the measured electrical property of the electrical circuit to an optical signal.

203: Sending the optical signal by means of the measurement probe 102.

204: Receiving the optical signal by means of the image sensor 101 configured to record images comprising the measurement probe that transmits the optical signal;

205: Processing the received optical signal in order to decode the measurement data.

206: Display the measurement data corresponding to the measured electrical property. The measurement system may in one embodiment comprise a display configured to display the measured electrical properties for each measurement probe. In other embodiments the measurement data is sent from the processing circuitry to an external computer for analysis.

The method may further comprise a calibration step wherein a reference value for the light emitted by measurement probe may be obtained for calibration of the measurement.

It is clear from this disclosure that the measurement probe 102 may send the measurement data as a digital optical signal and/or as an analogue optical signal. The analogue optical signal may carry information encoded as for example intensity and/or color.

Second Embodiment

Figure 3:
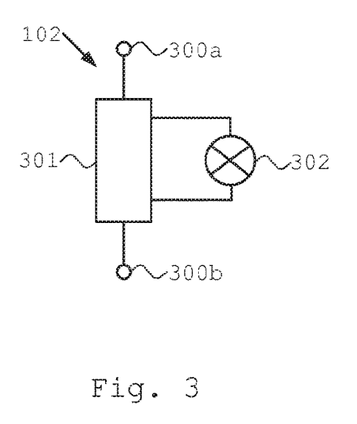
FIG. 3 is a circuit drawing of a measurement probe according to a second embodiment.

A second embodiment of the invention is shown in FIG. 3.

The second embodiment illustrates a circuit schematic of a measurement probe 102. The measurement probe 102 comprises a first terminal 300a and a second terminal 300b. Between the first terminal 300a and the second terminal 300b a measurement circuit 301 is connected. The measurement circuit 301 is configured to measure an electrical property by means of the first terminal 300a and the second terminal 300b. The measurement circuit 301 is further configured to convert the measured electrical property to an optical signal. The measurement circuit 301 further comprises means for sending the optical signal 302.

Third Embodiment

Figure 4:
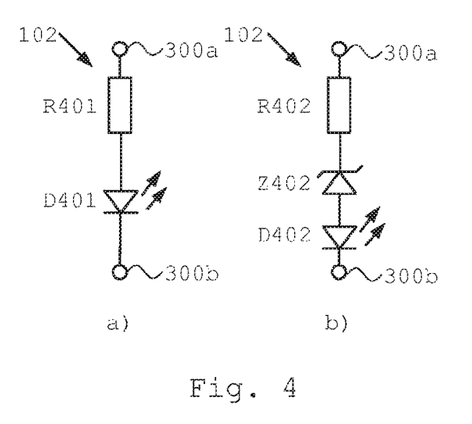
FIG. 4 is circuit drawings of measurement probes according to embodiments.

A third embodiment of the invention is shown in FIG. 4a).

The third embodiment illustrates a circuit schematic of the measurement probe 102. The measurement probe 102 comprises the first terminal 300a and the second terminal 300b. Between the first terminal 300a and the second terminal 300b is a serial circuit connected. The serial circuit comprises a light emitting diode (LED) D401 connected in series with a resistor R401. The LED will be 'on' as long as the voltage over the LED D401 is larger than the forward voltage drop of the LED D401 with an intensity that is determined by the current flowing through the LED D401.

Fourth Embodiment

A fourth embodiment of the invention is shown in FIG. 4b).

The fourth embodiment illustrates a circuit schematic of a measurement probe 102 that differs from the measurement probe 102 of the third embodiment in that the serial circuit further comprises a zener diode Z402. The zener diode Z402 starts to conduct current when the applied voltage over the zener diode Z402 reaches the zener voltage. This means that the LED D402 will start to emit light when the applied voltage over the series connected circuit reaches the zener voltage plus the forward voltage drop of the LED D402. By selecting a zener diode with a specific zener voltage the measurement region of the measurement probe 102 can be adjusted.

Fifth Embodiment

Figure 5:
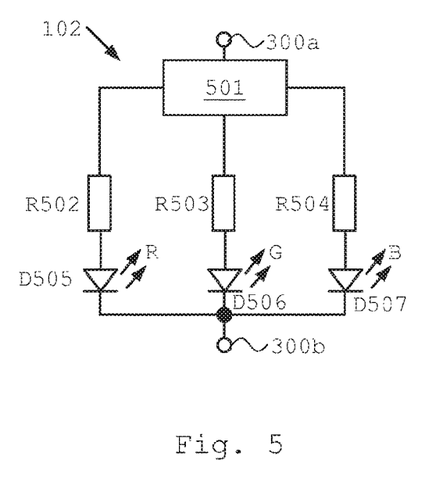
FIG. 5 is a circuit drawing of a measurement probe according to a fifth embodiment.

A fifth embodiment of the invention is shown in FIG. 5.

The fifth embodiment illustrates a circuit schematic of a measurement probe 102. The measurement probe 102 comprises a control circuit 501 connected to the first terminal 300a and configured to measure the voltage applied to the first terminal 300a. The measured voltage is used by means of the control circuit 501 for selecting a color and to transmit that color by means of controlling a red LED D505, a green LED D506, and a blue LED D507.

Sixth Embodiment

Figure 6:
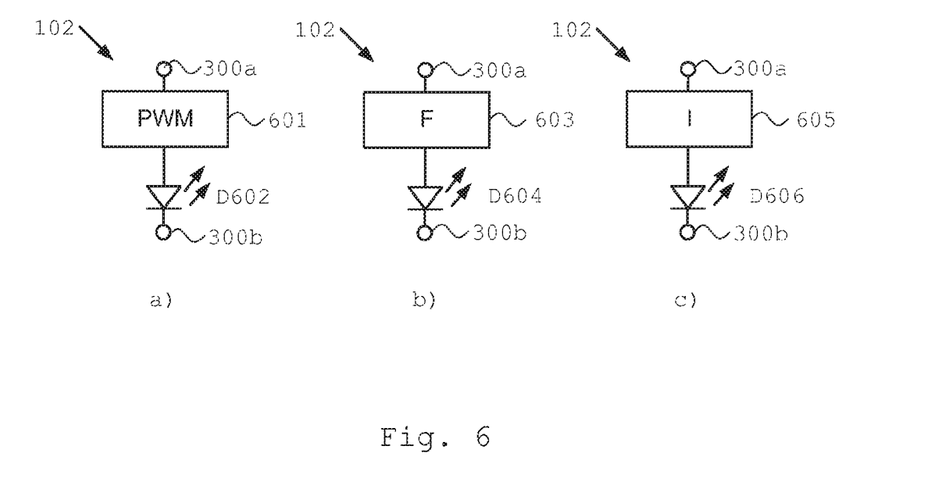
FIG. 6 is circuit drawings of measurement probes according to embodiments.

A sixth embodiment of the invention is shown in FIG. 6a).

The sixth embodiment illustrates a circuit schematic of a measurement probe 102. The measurement probe 102 comprises a pulse width modulation (PWM) control circuit 501 that converts a measured electrical property to a pulse width modulated optical signal. The PWM optical signal is transmitted by the LED D602, where the duty cycle of the optical signal corresponds to the measured electrical property.

Seventh Embodiment

A seventh embodiment of the invention is shown in FIG. 6b).

The seventh embodiment illustrates a circuit schematic of a measurement probe 102 that differs from the sixth embodiment in that the measurement probe 102 comprises a controlled oscillator (F) 603. The controlled oscillator converts the measured electrical property to a blinking frequency of a connected LED D604.

Eighth Embodiment

An eighth embodiment of the invention is shown in FIG. 6c).

The eighth embodiment illustrates a circuit schematic of a measurement probe 102 that differs from the seventh embodiment in that the measurement probe 102 comprises an intensity converter (I) 605 that converts the measured electrical property to an intensity of the emitted light from a connected LED D606.

Ninth Embodiment

Figure 7:
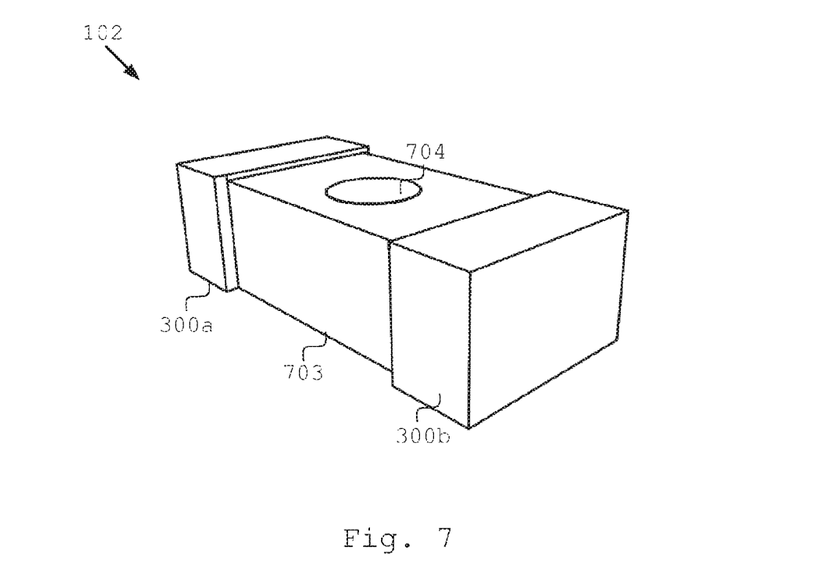
FIG. 7 is a perspective view of a measurement probe according to a ninth embodiment.

A ninth embodiment of the invention is shown in FIG. 7.

FIG. 7 shows the measurement probe 102 in a perspective view. The measurement probe 102 is configured to be soldered or glued either on top of an existing surface mount device (SMD) or onto a soldering pad of the PBA. In a first end the first terminal 300a is provided and in a second end the second terminal 300b is provided. The first terminal 300a and the second terminal 300b comprise regions suitable for soldering or gluing. The electronics of the measurement probe 102 is integrated in a body 703 between the first terminal 300a and the second terminal 300b. The body 703 comprises an opening 704 for the emitted light. The body 703 is further configured to house an electronic circuit according to embodiments.

Figure 8:
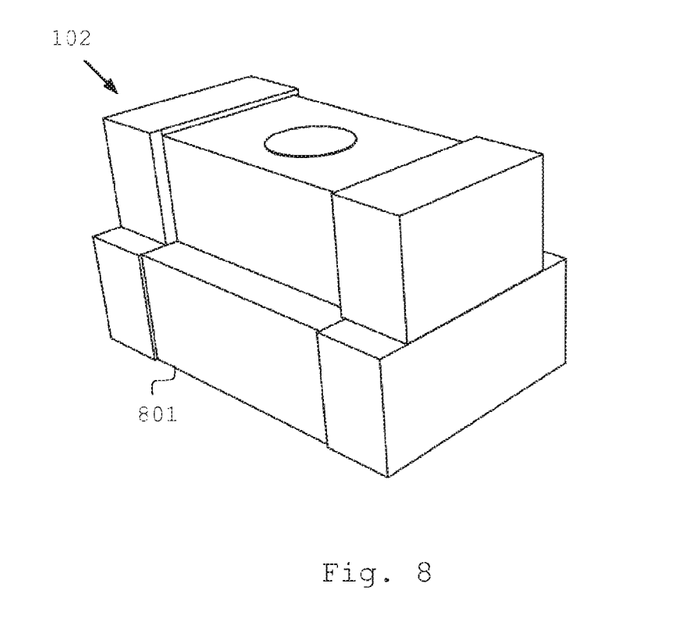
FIG. 8 is a perspective view of a measurement probe according to the ninth embodiment that is mounted on a surface mounted device.

In FIG. 8 the measurement probe 102 is mounted on top of a SMD 801 (piggy back) on the PBA 103, such as a resistor or a capacitor, by means of for example soldering or glue. The piggy back method of connecting the measurement probe 102 to an existing electrical component is very convenient and saves precious space on the PBA and no extra soldering pads are needed.

Tenth Embodiment

Figure 9:
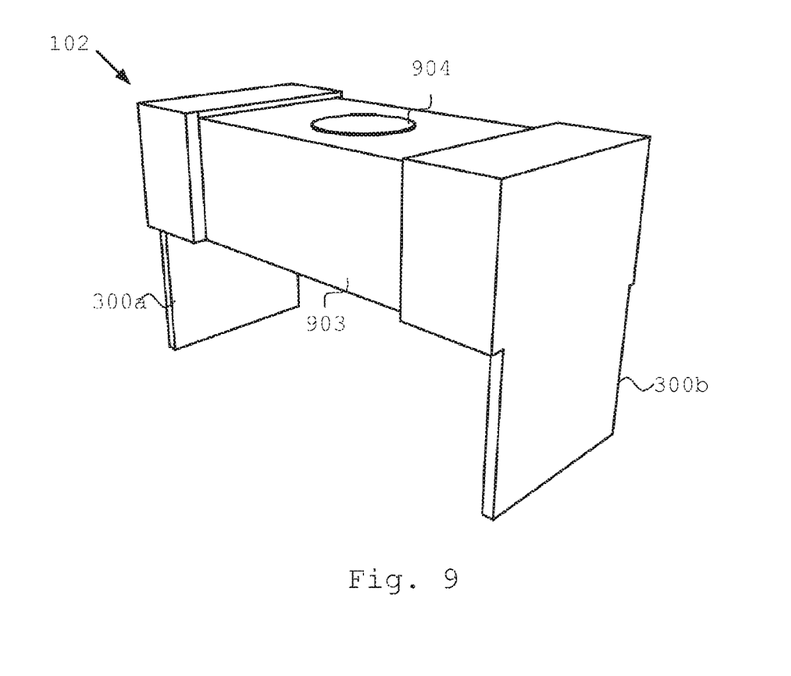
FIG. 9 is a perspective view of a measurement probe according to a tenth embodiment.

A tenth embodiment of the invention is shown in FIG. 9.

FIG. 9 shows the measurement probe 102 in a perspective view. The measurement probe 102 comprises the first terminal 300a in a first end, and the second terminal 300b in a second end. The first terminal 300a and the second terminal 300b are configured to provide electrical contact to a connectable SMD. In order to facilitate the electrical connection to the connectable SMD device the first terminal 300a and the second terminal 300b comprises corresponding elongated sides provided to increase the electrical connection area to the SMD. The elongated side's further acts as a clip configured to snap onto a SMD component. The measurement probe 102 comprises a body 903 arranged between the first terminal 300a and the second terminal 300b, the body 803 is provided to house the electrical components of the measurement probe 102. The body 803 further comprises an opening 804 that allows the light to be emitted.

Figure 10:
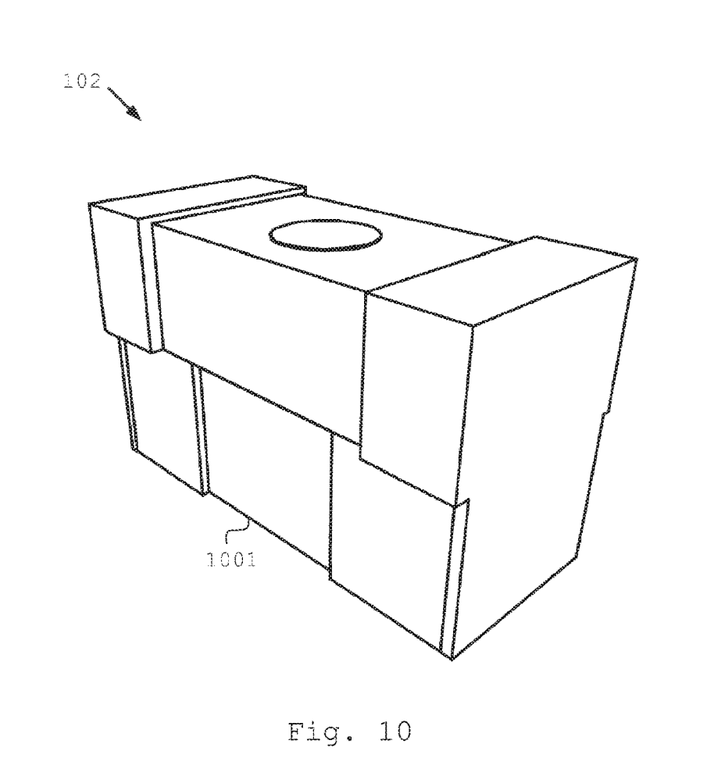
FIG. 10 is perspective view of a measurement probe according to the tenth embodiment mounted on a surface mounted device.

In FIG. 10 the measurement probe 102 is operatively connected to an existing SMD 1001 of the PBA 103 by means of snapping.

Eleventh Embodiment

Figure 11:
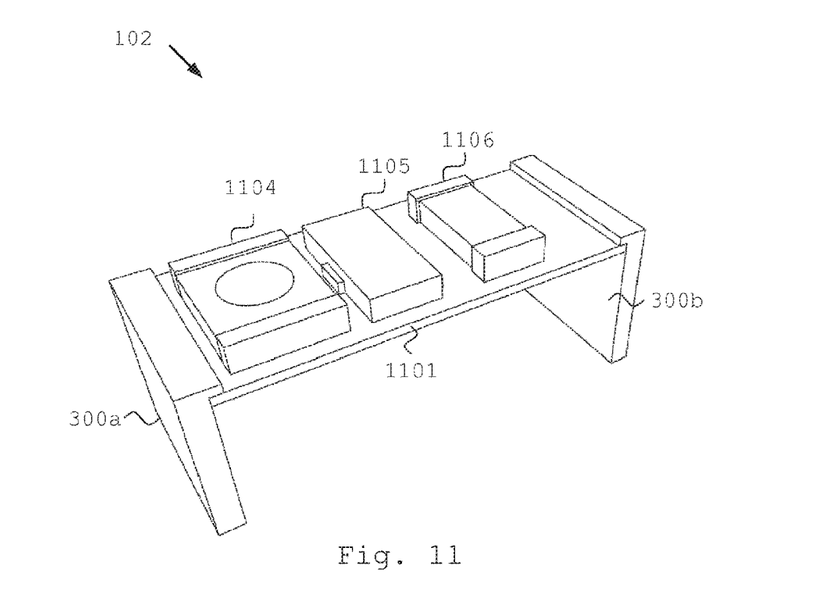
FIG. 11 is perspective view of a measurement probe according to an eleventh embodiment.

An eleventh embodiment of the invention is shown in FIG. 11.

FIG. 11 shows a measurement probe 102 that comprises a printed circuit board (PCB) 1101. The measurement probe comprises in a first end the first terminal 300a that protrudes from the PCB 1101, the second terminal 300b is provided in a second end of the PCB 1101 in a similar way as the first terminal 300a. The elongated sides can be used to clip on the measurement probe on to SMD devices. The measurement probe 102 comprise a LED 1104, a zener diode 1105, and a resistor 1106 mounted on the PCB 1101. The electrical circuit may be in accordance to the fourth embodiment. This measurement probe 102 may be mounted to a device under test (DUT) by means of soldering, gluing, or snap on. Other embodiments of circuits shown in this disclosure may be provided on the PCB 1101.

Use Scenario

In order to disclose the beneficial features of the disclosed embodiments an exemplary use scenario of the measurement system will now be discussed with reference made to FIG. 1. Assume in this scenario that the PBA 103 comprises a power converter circuit. This power converter circuit comprises a number of measurement probes 102 connected thereto. The measurement probes 102 are configured to monitor interesting voltages on the PBA 103, such as for example an output capacitor voltage. The image sensor 101 is a high speed camera configured to record sequences of images at a high speed (often several thousand images per second). The LED of the measurement probe 102 is of a high speed type capable of switching in the 100 ns region. The image capturing apparatus 101 is connected to a computer with a dedicated image analysis program. The power converter circuit is connected to the mains supply and the image capturing apparatus 101 is controlled by means of the computer to start recording images of the measurement probes 102 at a high speed. During this time the measurement probe 102 continuously monitor the voltage over the output capacitor and encodes this voltage to a light intensity that is transmitted by the LED of the measurement probe and captured on the recorded sequence of images. The recorded sequence of images are continuously decoded by means of the image analysis program on the computer and presented as voltage vs. time chart on a display of the processing circuitry.

This use scenario allows simultaneous monitoring of status signals as well as analogue voltages. If the measurement probes 102 comprises high speed LED's capable of switching in the 100 ns regime a measurement resolution of 10 microseconds is achievable with a high speed camera.

Many modifications of the disclosed embodiments are possible, and the list of disclosed embodiments is not exhaustive but merely illustrations of the inventive concept.

The invention claimed is:

1. A method for measuring an electrical property of an electrical circuit, comprising:
   measuring the electrical property using a measurement probe connected to the electrical circuit;
   converting the measured electrical property of the electrical circuit to an optical signal;
   sending the optical signal;
   receiving the optical signal using an image sensor configured to record images comprising the measurement probe that transmits the optical signal; and
   processing the recorded images in order to decode the measurement data from the received optical signal.

2. The method of claim 1, wherein the method further comprises receiving a trigger signal, and upon receiving the trigger signal start the recording of images.

3. The method of claim 1, wherein the image sensor is configured to record images at a frame rate in an interval of 1 fps (frame per second) up to 10000000 fps.

4. The method of claim 1, wherein the sending of the optical signal comprises controlling a state of a light emitting diode of the measurement probe.

5. The method of claim 4, wherein controlling the state of the light emitting diode comprises switching the light emitting diode on and off.

6. The method of claim 5, wherein the switching of the light emitting diode is performed at a frequency corresponding to a value of said measured electrical property.

7. The method of claim 5, wherein the switching of the light emitting diode is performed such that a duty-cycle of the optical signal corresponds to a value of said measured electrical property.

8. The method of claim 4, wherein controlling the state of the light emitting diode comprises controlling an intensity of an emitted light from the light emitting diode such that the intensity of the light corresponds to a value of said measured electrical property.

9. The method of claim 1, wherein the optical signal comprises information about the measured electrical property encoded as colors of the optical signal.

10. The method of claim 1, wherein the electrical circuit is provided on a printed circuit board comprising fiducial markers, wherein said fiducial markers are used in an image analysis to determine a position of the measurement probe on the electrical circuit.

11. A measurement system for measuring an electrical property of a connectable electrical circuit, comprising:
   a measurement probe configured to be connected to the connectable electrical circuit, wherein the measurement probe is configured to measure the electrical property of the connectable electrical circuit and to send information about the electrical property as an optical signal;
   an image sensor configured to record images of the optical signal transmitted from the measurement probe; and
   a processing circuitry configured to receive the recorded images from the image sensor and to control the image sensor, wherein the processing circuitry is configured to:
   control the image sensor to record images such that the optical information from the measurement probe is captured on the images; and process the recorded images in order to decode the measurement data from the received optical signal.

12. The system of claim 11, wherein the processing circuit is configured such that the processing circuit causes the image sensor to record the images in response to the processing circuit receiving a trigger signal.

13. The system of claim 11, wherein the image sensor is a high speed camera.

14. The system of claim 11, wherein the measurement probe comprises a light emitting diode provided for sending the information about the electrical property as an optical signal.

15. The system of claim 14, wherein the measurement probe further comprises a controller configured to control the light emitting diode, wherein the controller is configured for switching the light emitting diode on and off.

16. The system of claim 15, wherein the controller is configured for switching the light emitting diode at a frequency corresponding to a value of said measured electrical property.

17. The system of claim 15, wherein the controller is configured for switching the light emitting diode at a duty-cycle corresponding to a value of said measured electrical property.

18. The system of claim 14, further comprising a controller, wherein the controller is configured to control the intensity of the light emitted from the light emitting diode such that the intensity of the light corresponds to a value of said measured electrical property.

19. The system of claim 14, wherein the measurement probe comprises a plurality of light emitting diodes, each having a different color, and the measurement probe is configured to send information about the measured electrical property as a color encoded optical signal.

20. The system of claim 11, wherein the electrical circuit is provided on a printed circuit board comprising fiducial markers, wherein the processing circuitry is configured to use said fiducial markers in an image analysis to determine a position of the measurement probe on the electrical circuit.

* * * * *